US005917148A

United States Patent [19]

Woehl et al.

[11] Patent Number: 5,917,148

[45] Date of Patent: Jun. 29, 1999

[54] STRAIN RELIEF FOR ELECTRICAL FITTINGS

[76] Inventors: Roger Woehl; Edward P. Goett, both of 30-A Mill St., Healdsburg, Calif. 95448

[21] Appl. No.: 08/828,829

[22] Filed: Mar. 19, 1997

[51] Int. Cl.[6] .................... H05K 9/00

[52] U.S. Cl. .................... 174/35 C; 174/135; 248/74.3; 285/252; 285/417

[58] Field of Search .................... 248/74.3; 285/252, 285/417; 174/65 R, 35 C, 84 R, 40 CC, 135, 5 SG, 73.1

[56] References Cited

U.S. PATENT DOCUMENTS 5,430,252 7/1995 Petersen .................... 174/65 R

*Primary Examiner*—Kristine Kincaid
*Assistant Examiner*—Hung V Ngo
*Attorney, Agent, or Firm*—Larry D. Johnson

[57] ABSTRACT

A strain relief for electrical fittings includes a body portion having a pair of ends, the first end for attachment to a connector, and the second end having a worm drive clamp for releasable clamping upon a cable. The strain relief may include a flexible boot to provide a sealing function, or a flexible tube of braided shielding wire to provide EMI shielding.

16 Claims, 5 Drawing Sheets

STRAIN RELIEF FOR ELECTRICAL FITTINGS

FIELD OF INVENTION

The present invention relates to devices for terminating end fitting hardware to electrical cables while providing wire strain relief. Further, this invention relates to a termination system that can be installed and repaired using only a screwdriver.

BACKGROUND OF THE INVENTION

DESCRIPTION OF THE PRIOR ART

Repairable systems for providing strain relief to flexible cables at the point of transition to hardware have fallen into two categories: mechanical clamps and shrinkable boots. Each of these systems has its distinct advantages and drawbacks, but neither provides a complete solution for repairable strain relief and sealing.

Saddle clamps are the most common method of providing strain relief. Such clamps typically consist of two parallel bars joined by screws passing between them at each end. By turning the screws, the bars move closer together, thereby providing a clamping force. The bars are held to end fitting hardware by clamping to an extended portion of the end fitting hardware that is placed between the two bars. This method of clamping is advantageous for two reasons. First, it can be installed and prepared using only a screwdriver. Second, when the clamps are open, the end fitting hardware can be slid down the outside of the cable, allowing the end of the cable to be accessed and repaired, such as is typical with electrical backshell hardware.

However, saddle clamps also have many disadvantages, including:

The clamping ability of saddle clamps is marginal. They clamp only on two sides, forcing round cables into an oval configuration.

They have a narrowly limited size range. When cables are too small, the clamps tighten on the end fitting tabs before they are tight on the cable—leaving the cable loose. When the cable is too big, the clamps tighten on the cable before getting tight on the hardware tabs, leaving the hardware loose. The only way to insure solid clamping is to oversize the clamp, and use a rubbery grommet or tape around the wire bundle.

Including the grommet, the screws and two bars, the saddle clamp has five separate components, excluding the hardware body and washers.

Saddle clamps do not provide a moisture seal between an end fitting and the cable jacketing, and additional components must be added to achieve good sealing. Saddle clamps also do not provide an EMI seal between the end fitting and a cable bulk shielding, and additional components must be added for this purpose. Good grounding is achieved only with the addition of a jumper cable attched between a cable shield and the clamp screws.

Without special thread inserts, or lockwashers, saddle clamps will come loose under vibration.

Saddle clamps have sharp screw ends protruding so as to be a potential source of cuts and scrapes to any wires, surface finishes, or mechanic's hands in their vicinity. Their bulk profiles with protruding points are aesthetically unpleasant and give an unfinished appearance.

Despite all of these negative features, saddle clamps remain popular because they are easy to repair, and do not require any special tooling.

Shrinkable boots are one alternative to saddle clamps. They have a sleek low profile with no protruding surfaces. When used lined with adhesives they can provide moisture sealing along with some axial strain relief. Shrinkable boots can accommodate a wide range of sizes. Shrinkable boots address many of the aesthetic problems of saddle clamps, but lack their ease of repair. Once installed, a boot cannot be repaired, and must be cut off and replaced with a new boot. Heat shrinkable boots require the use of a special heat gun for proper installation or repair. In many cases heat guns cannot be used around fueled aircraft, resulting in additional installation and repair problems. Although several shrinkable systems have been proposed that can provide EMI shielding, they have generally not found wide acceptance because of poor shielding and grounding. The recovery force of shrinkable systems is insufficient to provide solid electrical grounding.

A third type of repairable strain relief system is the wedge and grommet type. These systems utilize a rubber grommet or bushing that is compressed radially inward by a compression nut. A circular bushing is slid over a cable and sandwiched between the end fitting body and the threaded compression nut. The nut slides over the grommet and screws onto the body, so that a wedged surface on the nut can drive the grommet down around the cable jacketing. While these systems offer repairable sealing and strain relief, their size range is very limited so that the grommet needs to be carefully sized to fit the cable. Nut and wedge systems can be expanded to include EMI shielding, however, this increases the number of components, and the complexity of the assembly, requiring the installer to handle multiple components.

One method of clamping circular items that has been in use in the hydraulic industry is the worm drive clamp, commonly known as a hose clamp. Hose clamps are popular because they are extremely easy to operate, requiring only a screwdriver. They are reusable and can accommodate a wide range of hose sizes. They provide a strong radial clamping force capable of sealing to high pressures. The clamping performance of hose clamps has been established from years of use, and they are commonly used in jet aircraft engines and in areas of high vibration and temperature extremes. They are widely available and relatively low in cost.

Hose clamps as they currently exist are not widely used in the electrical interconnect industry as a means for providing sealing or strain relief. There are several reasons for this, some functional, others pertaining to industry preferences. To secure a cable to an end fitting, a circular ferrule portion of the end fitting must first be placed under the cable jacket, and then the hose clamp can be used to compress the jacketing against the ferrule. While the thin cable jacketing is secured and sealed, the internal wires remain unsupported from pulling or bending. Further, the diameter of the ferrule must be closely sized to the diameter of the cable jacketing, limiting the range of sizes it can accommodate. It is conceivable that a hose clamp could be used to strap a cable bundle to a post or arm extending from an end fitting, however this would not allow for sealing or EMI shielding. Using the clamp as a strap is also undesirable because a loose end of the band extends past the housing when the clamp is tightened. This loose end can catch on wires, cause scrapes in neighboring components, and generally gives an unfinished appearance to a cable assembly. In the electrical interconnect industry hose clamps are regarded as bulky items that give a "hacked" together appearance. To some extent this reputation is undeserved, and the prejudice limits their use when they might otherwise be appropriate.

There is no single product that can provide both strain relief and sealing in a system that is easily installed and repaired, in a wide range of cable sizes, and requiring no special tools. Further, no single product exists that can provide strain relief and EMI shielding in a system that is easily installed and repaired, in a wide range of cable sizes, and requiring no special tools.

OBJECTS OF THE INVENTION

It is an object of the present invention to provide a clamping strain relief for wire cable.

It is a further object of the present invention to provide clamping that requires only a screwdriver to install and repair.

It is a further object of the present invention to provide a clamp with 360 degrees of radially inward clamping force.

It is a further object of the present invention to provide a cable clamping device with no protruding surfaces to scrape or damage neighboring components.

It is a further object of the present invention to provide a cable strain relief that provides a moisture seal to the outer jacket of cable.

It is a further object of the present invention to provide a cable strain relief capable of accommodating a wide range of cable sizes.

It is a further object of the present invention to provide a cable stain relief that can provide electromagnetic magnetic interference (EMI) shielding across a wide range of sizes.

It is a further object of the present invention to provide a cable strain relief that can function as a re-sealable boot.

It is a further object of the present invention to provide a cable strain relief and re-sealable boot that be installed and repaired without special tools or additional products.

It is a further object of the present invention to provide a cable strain relief and seal that allows end fitting hardware to be slid back down the cable for repair.

It is a further object of the present invention to provide a cable strain relief and seal that remains tight during heavy vibration.

It is a further object of the present invention to provide a cable strain relief and seal that can be readily retrofitted on existing electrical hardware.

It is a further object of the present invention to provide a cable strain relief and EMI shield that can accommodate multiple cable bundles.

SUMMARY OF THE INVENTION

In its simplest embodiment, the present invention is a strain relief including a circular body and a worm drive clamp, commonly known as a hose clamp. The body is a structural ring having at one end some means for attachment to a further body, such as threading or crimping, and a second end having a notch or a hole. Passing through the notch is the housing portion of the worm drive clamp, giving external access to the worm drive with a screwdriver. The band portion of the worm clamp is located inside the ring so that when fully expanded, the band's external diameter matches the internal diameter of the ring. The housing of the worm drive clamp can be rigidly attached to the body by various means such as welding or crimping, so that when the clamp is tightened around a cable passing through the clamp and body, it will be rigidly secured to the body.

This configuration has several distinct advantages. It accommodates a wide range of cable diameters with a single integral component, requiring only a screwdriver to install and repair. It can be open and closed many times. Once tight the cable is clamped with 360° of radially inward directed force, holding it securely to the clamp housing which is rigidly attached to the body. As the clamp is tightened the portion of the band that extends from the housing is captured within the interior of the body, thereby preventing it from protruding and damaging neighboring components.

In addition to being able to run circular cables through the center of the clamp, it is also possible to pass ribbon cable, or strands of individual wires between the inside diameter of the body and the outside diameter of the band while the band is collapsed. By then expanding the band the wire or ribbon cable can be securely clamped between the outside the band and the inside diameter of the body. Used in this way, the radial clamp is ideal for flat ribbon cable which must transition to a round connector. Further, by using two clamps in series, one clamping inward, and one clamping outward, hybrid cables of fiber optics and electrical wires can be separated and individually strain relieved.

The aesthetics and function of the basic strain relief can be improved by molding or shrinking a plastic jacketing around the outside of the body and clamp housing. A small access hole in the jacketing provides screwdriver access to the worm drive. The jacketing provides a clean profiled appearance, and eliminates any corners and protrusions that could catch on wires or scrape neighboring components.

The embodiment as described above can be expanded to include moisture sealing with the addition of a grommet or boot. The boot may consist of a tube of elastomeric material that is sealed to the inside of the body, forward of the clamp band, then passed through the band to extend out the back. A jacketed cable which is passed through the boot and body can be sealed by tightening the clamp. The clamp compresses the grommet around the cable jacket, thereby providing both a moisture seal and strain relief. The back end of the boot can be folded back up over the body and clamp housing, thereby providing a clean external profile without the need for a separate plastic cover. Folding the jacket back also holds it expanded and open on the end so that it will not fold inward and collapse when the boot is compressed. It also completely hides the internal components of the clamp, improving the aesthetics, and protecting it from dirt, grit and other foreign objects. Covering the worm drive clamp improves the marketability of the product to customers who have a prejudicial view toward the use of hose clamps for electrical interconnect applications.

The sealing embodiment described above can be modified so that the clamp can serve an electrical shielding function rather than a moisture sealing function. By replacing the elastomeric grommet with a tube of braided shielding wire, the clamp can provide strain relief with an EMI shield that can collapse to accommodate a wide range of cable sizes. In this configuration the clamp is ideal for cables with an outer braided shield for electromagnetic shielding. This configuration can also be used to ground the individual shields of multiple internal cables.

The design of the strain relief body can be varied to interface with many different types of electrical end fittings, including connectors, plugs, receptacles, backshell hardware, bulkhead fittings, cable branches, cable splices, and others. The body can be made to be integral with any type of end fitting hardware. The worm drive housing can be made integral with the body.

In yet another embodiment, the body is integral with a sealing grommet and the worm drive is flexibly secured to the body/grommet. The amount of strain relief is less then the other embodiments, but may be sufficient for many applications. The amount of strain relief is governed by the stiffness or durometer of the elastomer used in the body/grommet. This embodiment is desirable because it has a lower manufacturing cost, and it allows the clamp to center itself around a cable. A self centering clamp is an advantage with stiff cables that cannot be pulled to one side of the body as in done in the other embodiments. The flexible body/grommet can be secured to further end fitting hardware by means of clamping, crimping, or adhesives.

This invention could be manufactured with strapping or clamping systems other than a worm drive. Possible types of bands include cable ties or buckle type banding systems. Constructed with other bands could reduce cost and size, at the likely expense of repairability.

DETAILED DESCRIPTION OF THE PREFERRED EMBODIMENT

Figure 1A:
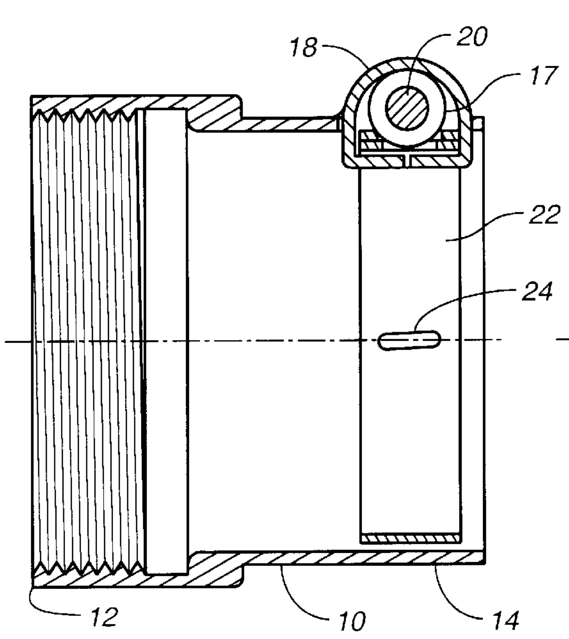
FIG. 1*a* is a side elevation cross-sectional view of a strain relief (only) embodiment of the invention.
Figure 1B:
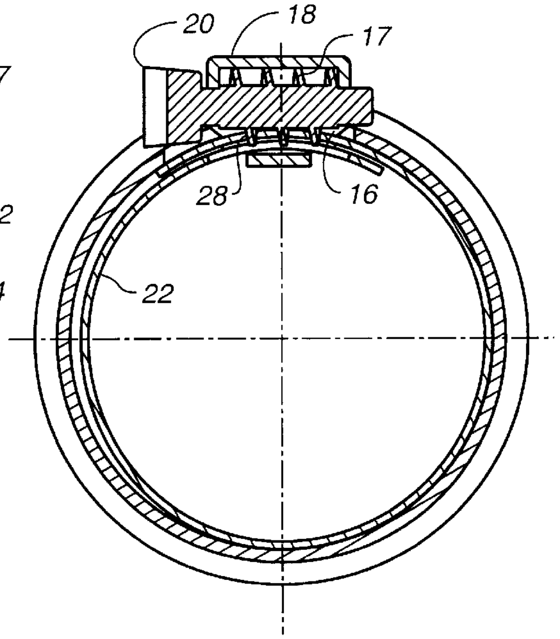
FIG. 1*b* is an end elevation cross-sectional view of FIG. 1*a;*

The strain relief and electrical end fitting of this invention is shown in FIGS. 1*a* and 1*b* in its simplest embodiment including a generally cylindrical body 10 having at a first end 12 a means for attachment to a further body, and at a second end 14 a means for attachment to an electrical cable or conduit. The first end 12 may contain any number of means for attaching to a further body including threading, crimping or spin couplings, and where the further body can include connectors such as electrical plugs, receptacles, backshell hardware, junction boxes, branching, splices or other hardware devices common to the electrical interconnect industry. Turning now to the second end 14, a worm drive clamp 17 is generally encapsulated within the second end 14 such that a circular band 22 is internal to the cylindrical body, and a worm drive screw 20 and housing 18 are located externally. The screw 20 and housing 18 are positioned tangentialy on the second end 14. A gap, notch or hole 16 in the circumference of the second end 14 permits threads 28 of screw 20 to engage lateral notches 24 in band 22. The engagement of the threads in the notches is such that when the screw is turned in a first direction the diameter of band 22 will be reduced, and when the screw is turned in a second direction the diameter of band 22 will be increased.

Figure 1C:
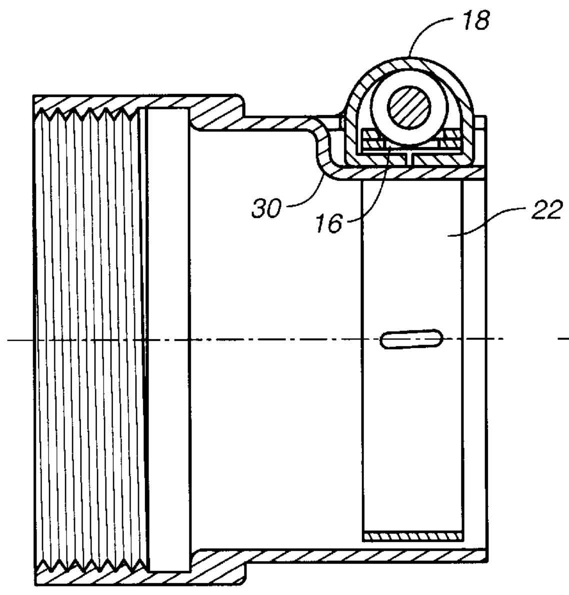
FIG. 1*c* is a side elevation cross-sectional view of an alternate embodiment of FIG. 1*a;*
Figure 1D:
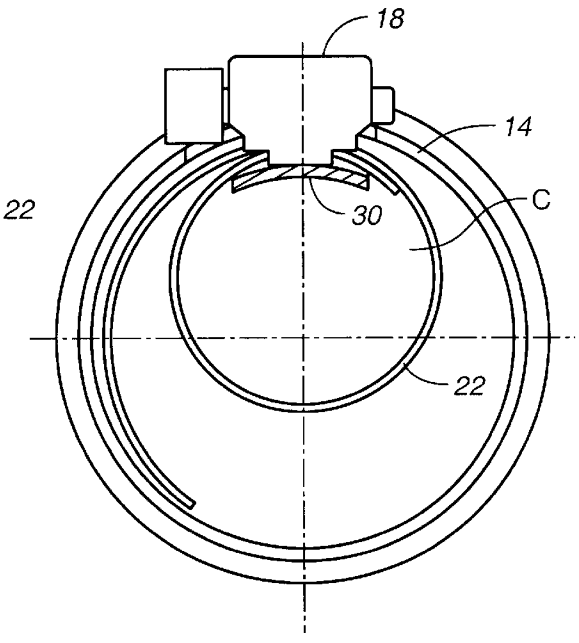
FIG. 1*d* is an end elevation view of the embodiment of FIG. 1*c* with the clamp having been reduced in diameter.

The housing 18 may be integrally formed into the second end 14, or may consist of a commercially available hose clamp attached to the body end 14 by any number of means, including welding, riveting, screwing, or compression fitting. As shown in FIG. 1*c*, The body may be constructed with a rigidly attached arm 30 positioned in the interior of the band 22 directly beneath the housing 18 located in a notch 16. In this configuration the clamp would be captivated but not rigidly secured to the body until such time as the band 22 is tightened around a cable C (as in FIG. 1*d*), thereby rigidly clamping both the cable C and the housing 18 to the second end 14 by way of arm 30. This configuration has the advantage of reducing manufacturing cost.

Figure 2A:
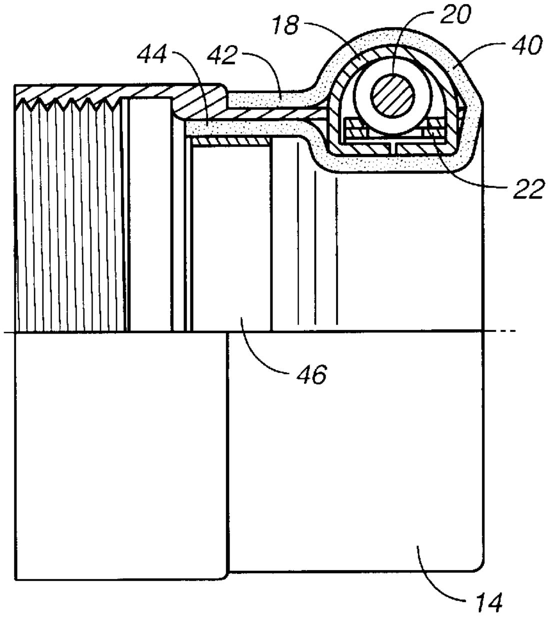
FIG. 2*a* is a side elevation view in partial cross section of a strain relief and seal embodiment of the invention.
Figure 2B:
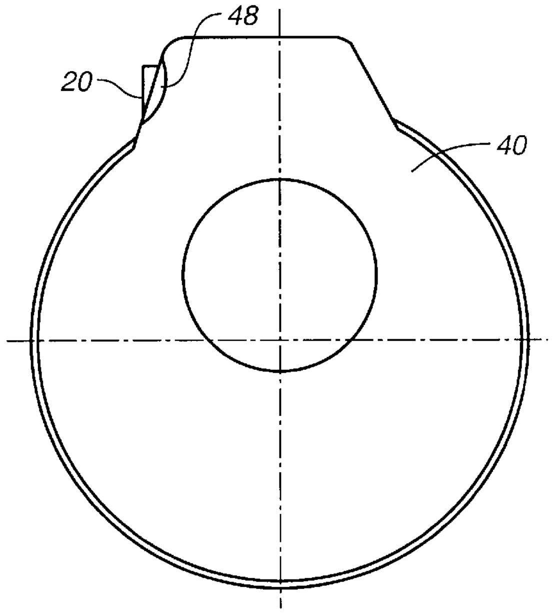
FIG. 2*b* is an end elevation view of the embodiment of FIG. 2*a* with the clamp having been reduced in diameter.

The embodiment as described above is the simplest manifestation of the invention described herein, and provides only the benefits of a strain relief to a wire bundle or cable. This basic function can be improved, as shown in FIGS. 2*a* and 2*b* with the addition of a sealing grommet or boot 40. The boot 40 is a tubular cylinder of elastomeric material, such as neoprene rubber. The boot is located at the interior of the band 22 and the second end 14, with a first end 44 of the boot extending axially and radially inward of the band 22. The end portion 44 is circumferentially sealed to the internal surface of second end 14 by means of an adhesive, or, as depicted in FIG. 2*a*, by a cylindrical ring 46 which forces the boot radially outward against the interior surface. A second boot end 42 is folded back over the exterior of second end 14, turning the boot 40 inside out to form a protective cover over the worm drive screw 20 and housing 18. A hole 48 in the boot 40 is positioned at the location of the screw 20 so as to allow access to the screw slot with a screwdriver.

A boot liner may be necessary to guide the hose clamp end to wrap around on itself. Without the liner, the end of the clamp may poke into the rubber boot and cause it to deform or tear. The liner can be a metal band that is hard enough to deflect the end of the clamp band, but still flexible enough to wrap around the clamp as its diameter is reduced during tightening. In the expanded condition of the clamp, the guide should extend roughly half the circumference of the band, starting at the housing. This length will allow the guide to wrap completely around the band when the clamp diameter is reduced to half of its maximum size.

Figure 3A:
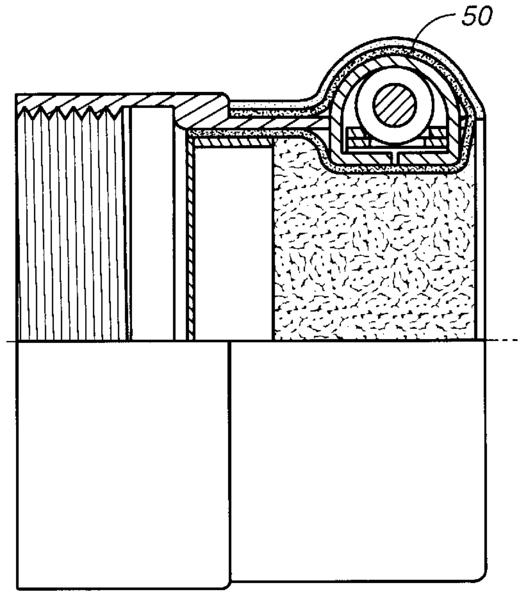
FIG. 3*a* is a side elevation view in partial cross section of a strain relief with shielding embodiment of the invention.
Figure 3B:
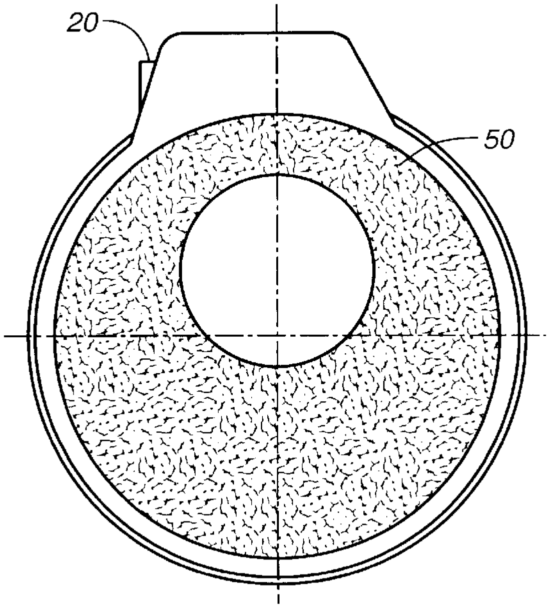
FIG. 3*b* is an end elevation view of the embodiment of FIG. 3*a* with the clamp having been reduced in diameter.

FIGS. 3*a* and 3*b* illustrate a strain relief with EMI shielding embodiment of the invention. Hear, the boot or grommet of FIGS. 2*a* and 2*b* is replaced with a tube of braided shielding wire 50, adapted to reduce in diameter with the clamp band to clamp upon a wide range of cable sizes, all as described supra.

Figure 4A:
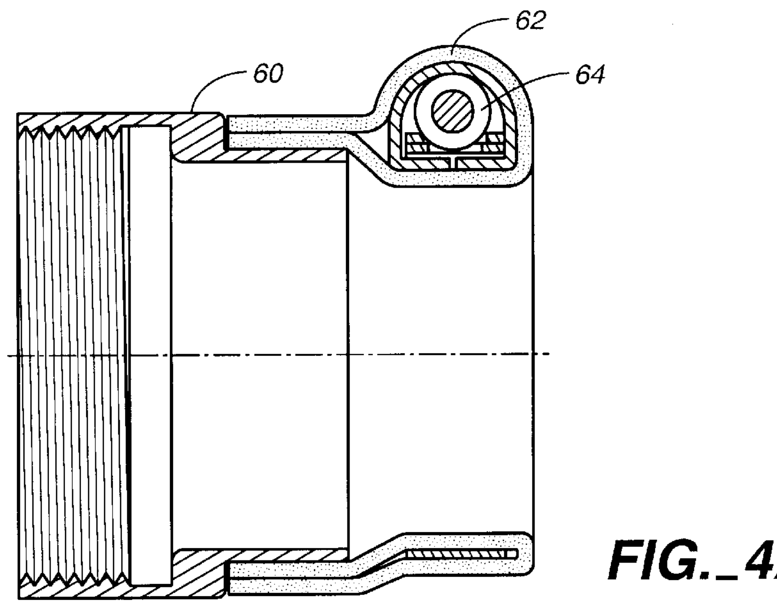
FIG. 4*a* is a side elevation cross-sectional view of an alternate centering-type strain relief and sealing embodiment of the invention.
Figure 4B:
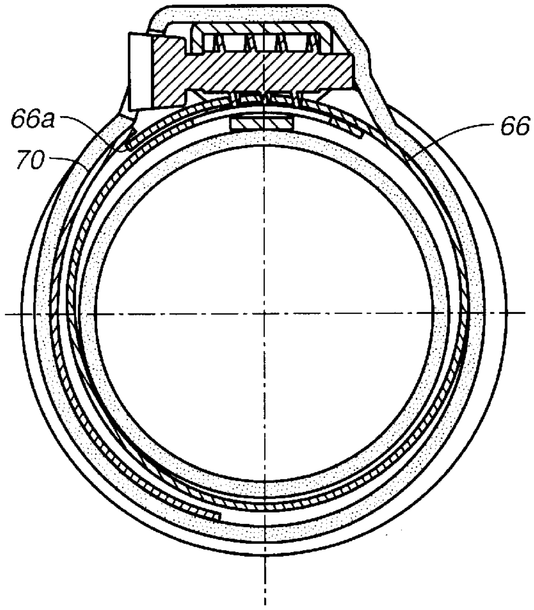
FIG. 4*b* is an end elevation cross-sectional view of the embodiment of FIG. 4*a;*
Figure 4C:
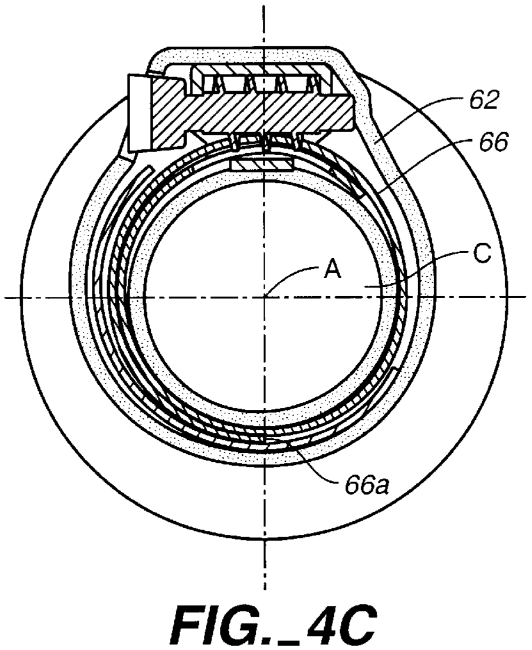
FIG. 4*c* is an end elevation cross-sectional view of the embodiment of FIG. 4*b* with the clamp having been reduced in diameter.

FIGS. 4*a*, 4*b* and 4*c* illustrate a centering-type strain relief and sealing embodiment of the invention. Here, the second end of the body 60 consists of flexible boot 62, such that the worm drive 64 is flexibly (as opposed to rigidly) secure to the body/boot. Thus, when band 66 is reduced in diameter about a cable C (as in FIG. 6*c*), the worm drive 64 is permitted to move radially inward, and the band 66 remains more or less centered (coaxial) with the body, boot, and cable about central axis A. This is in contrast with the non-centering reduction in diameter achieved with the embodiments of FIGS. 1, 2 and 3.

FIGS. 4*b* and 4*c* also illustrate the use of a guide or boot liner 70, used to guide the end 66*a* of band 66 within the boot 62 as diameter is reduced (from FIG. 4*b* to FIG. 4*c*) about the cable, and prevent damage to the boot.

Figure 5A:
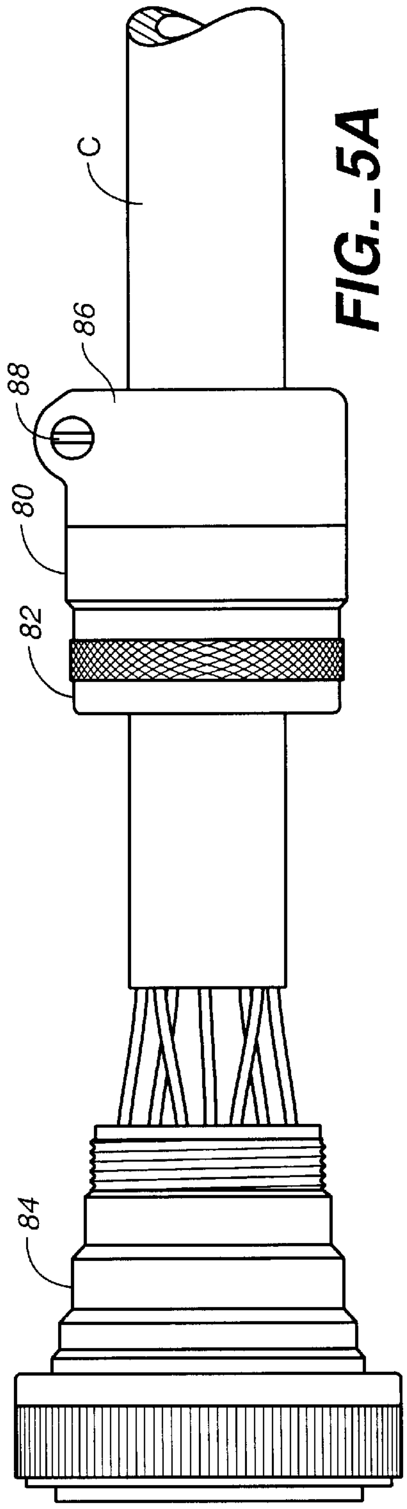
FIG. 5*a* is a side elevation view of a strain relief of this invention as installed on a cable before attachment to a further body.
Figure 5B:
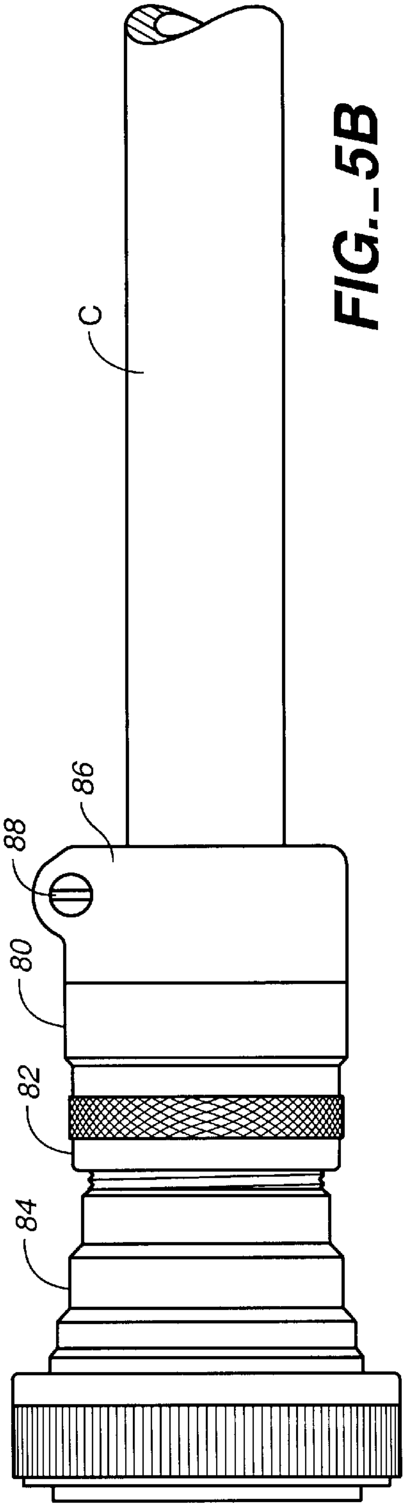
FIG. 5*b* is a side elevation view of the embodiment of FIG. 5*a* as attached to the further body.
Figure 6:
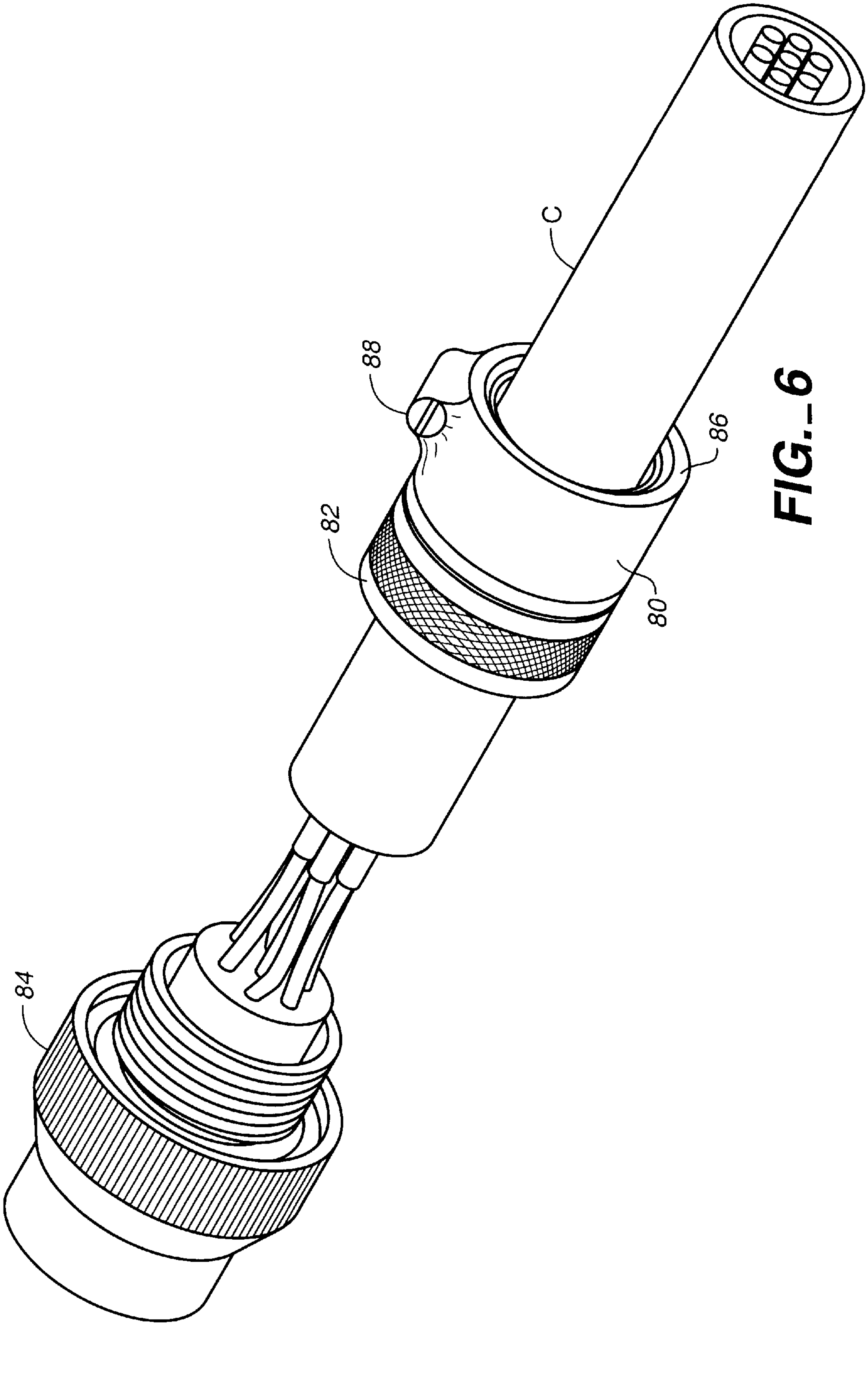
FIG. 6 is a perspective view of a strain relief of this invention as installed on an electrical cable adjacent in fitting hardware.

FIGS. 5*a*, 5*b* and FIG. 6 illustrate a strain relief 80 of this invention being installed on a cable C, then slid along cable C so that first end 82 may be attached to further body 84 (here, by threads), and the clamp 86 of the strain relief may be reduced in diameter about cable C by turning of screw head 88.

While this invention has been described in connection with preferred embodiments thereof, it is obvious that modifications and changes therein may be made by those skilled in the art to which it pertains without departing from the spirit and scope of the invention. Accordingly, the scope of this invention is to be limied only by the appended claims.

What is claimed as invention is:

1. A cable sealing and strain relief apparatus for releasable clamping of an end fitting to an electrical cable or conduit, said sealing and strain relief apparatus comprising:

a hose clamp having a circular band, and a screw drive mechanism;

a generally cylindrical flexible boot having a first end and a second end, said first end having a means for attaching to an electrical end fitting; and said second end having an inner section positioned radially inward of said hose clamp, and an outer section positioned radially outward of said hose clamp, said outer section having a suitable access to said screw drive mechanism whereby when said screw drive is turned in a first direction, said circular band is reduced in diameter about a cable and said flexible boot forms a seal against said cable, and when said screw drive is turned in a second direction said circular band is increased in diameter.

2. A clamping apparatus for releasable securing of an end fitting to a flexible cable, said clamping apparatus comprising:

a generally cylindrical body portion having a first end and a second end, an outside surface, and an internal volume;

said first end including a means for attachment to a further body; and said second end including a worm drive clamp having a screw housing, a worm drive screw being accessible from said outside surface, and a circular band in said internal volume, wherein said body portion includes an arm portion positioned radially inward of said circular band, and said worm drive clamp is captivated by said arm portion, whereby when said worm drive screw is turned in a first direction said band is reduced in diameter within said internal volume, and when said worm drive screw is turned in a second direction said band is increased in diameter within said internal volume.

3. The claimping apparatus of claim 2 wherein said means for attachment to a further body comprises an element taken from the group of threaded element, crimped element, and spin coupled element.

4. The clamping apparatus of claim 2 wherein said worm drive clamp includes threads to engage lateral notches in said circular band.

5. The clamping apparatus of claim 2 wherein said worm drive clamp is rigidly connected to said body portion.

6. A clamping apparatus for releasable securing of an end fitting to a flexible cable, said clamping apparatus comprising:

a generally cylindrical body portion having a first end and a second end, an outside surface, and an internal volume;

said first end including a means for attachment to a further body; and said second end including a worm drive clamp having a screw housing, a worm drive screw being accessible from said outside surface, and a circular band in said internal volume, wherein said body portion includes a tubular flexible boot surrounded by said circular band, whereby when said worm drive screw is turned in a first direction said band is reduced in diameter within said internal volume, and when said worm drive screw is turned in a second direction said band is increased in diameter within said internal volume, wherein when said circular band is reduced in diameter about a cable, said flexible boot forms a seal against said cable.

7. The claimping apparatus of claim 6 wherein said means for attachment to a further body comprises an element taken from the group of threaded element, crimped element, and spin coupled element.

8. The clamping apparatus of claim 6 wherein said worm drive clamp includes threads to engage lateral notches in said circular band.

9. The clamping apparatus of claim 6 wherein said boot includes a boot liner to guide said circular band during reduction in diameter.

10. The clamping apparatus of claim 6 wherein said worm drive clamp is flexibly connected to said body portion.

11. The clamping apparatus of claim 6 wherein said generally cylindrical body portion and said worm drive clamp circular band are coaxial with the cable when said circular band is reduced in diameter about the cable.

12. A clamping apparatus for releasable securing of an end fitting to a flexible cable, said clamping apparatus comprising:

a generally cylindrical body portion having a first end and a second end, an outside surface, and an internal volume;

said first end including a means for attachment to a further body; and said second end including a worm drive clamp having a screw housing, a worm drive screw being accessible from said outside surface, and a circular band in said internal volume, wherein said body portion includes a tube of shielding material surrounded by said circular band, whereby when said worm drive screw is turned in a first direction said band is reduced in diameter within said internal volume, and when said worm drive screw is turned in a second direction said band is increased in diameter within said internal volume, wherein when said circular band is reduced in diameter about a cable, said tube of shielding material forms an EMI shield against said cable.

13. The clamping apparatus of claim 12 wherein said means for attachment to a further body comprises an element taken from the group of threaded element, crimped element, and spin coupled element.

14. The clamping apparatus of claim 12 wherein said worm drive clamp includes threads to engage lateral notches in said circular band.

15. The clamping apparatus of claim 12 wherein said worm drive clamp is flexibly connected to said body portion.

16. The clamping apparatus of claim 12 wherein said generally cylindrical body portion and said worm drive clamp circular band are coaxial with the cable when said circular band is reduced in diameter about the cable.

* * * * *